United States Patent [19]

Iwamura

[11] Patent Number: 5,172,417
[45] Date of Patent: Dec. 15, 1992

[54] APPARATUS FOR CONTROLLING ACOUSTICAL TRANSFER CHARACTERISTICS

[75] Inventor: Hiroshi Iwamura, Tokyo, Japan

[73] Assignee: Pioneer Electronic Corporation, Tokyo, Japan

[21] Appl. No.: 784,731

[22] Filed: Oct. 28, 1991

Related U.S. Application Data

[63] Continuation of Ser. No. 514,058, Apr. 24, 1990, abandoned.

[30] Foreign Application Priority Data

May 17, 1989 [JP] Japan .................................. 1-123589
Jun. 16, 1989 [JP] Japan .................................. 1-154233

[51] Int. Cl.⁵ .............................................. H03G 5/00
[52] U.S. Cl. .................................................. 381/103
[58] Field of Search ................ 381/103, 63, 96, 98

[56] References Cited

U.S. PATENT DOCUMENTS

| | | | |
|---|---|---|---|
| 4,610,024 | 9/1986 | Schulhof | 381/103 |
| 4,739,514 | 4/1988 | Short et al. | 381/103 |
| 4,751,739 | 6/1988 | Serikawa et al. | 381/103 |
| 4,852,176 | 7/1989 | Truhe, Jr. | 381/103 |
| 5,040,220 | 8/1991 | Iwamatsu | 381/63 |

FOREIGN PATENT DOCUMENTS 2068678  8/1981  United Kingdom ............... 381/103

Primary Examiner—Forester W. Isen
Attorney, Agent, or Firm—Sughrue, Mion, Zinn, Macpeak & Seas

[57] ABSTRACT

An apparatus for controlling acoustical transfer characteristics having an input section for inputting data on acoustical transfer decision factors determining the acoustical transfer characteristics of an audio reproduction output signal, an arithmetic section for calculating a value of control of the acoustic transfer characteristics of the audio reproduction output signal by fuzzy inference based on the decision factors, and an operational section for changing the acoustical transfer characteristics. The factors for compensating for auditory sensation characteristics vary depending upon the sound volume level. Acoustic transfer characteristics suitable for the auditory sensitivity characteristics of the listener with changes in the sound volume can be obtained by a simple operation.

15 Claims, 15 Drawing Sheets

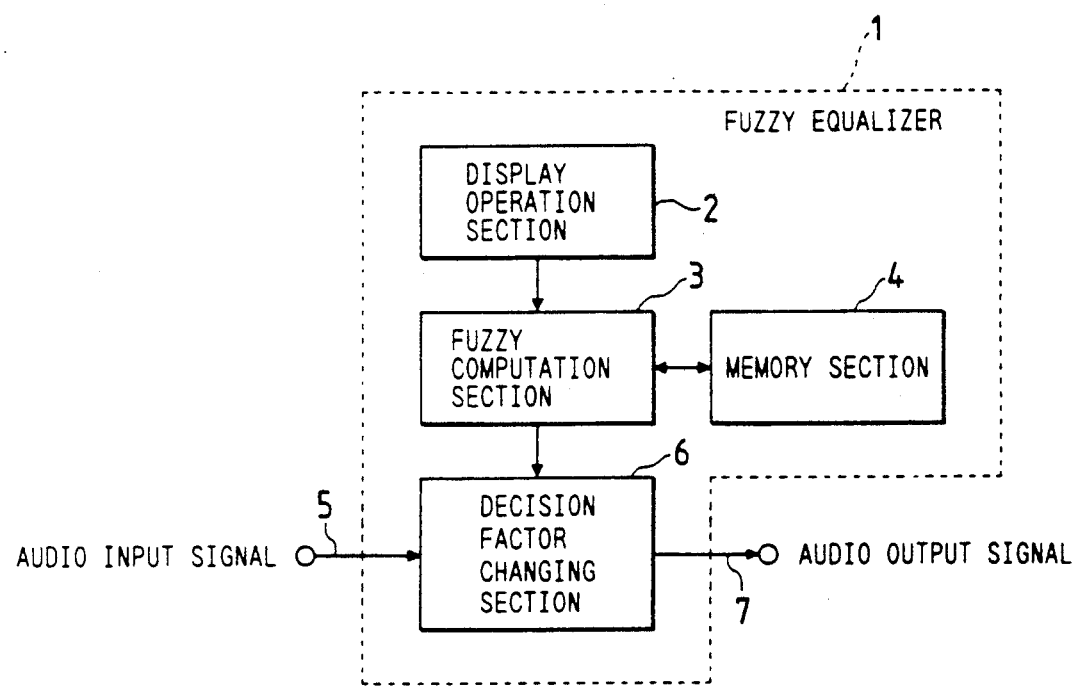

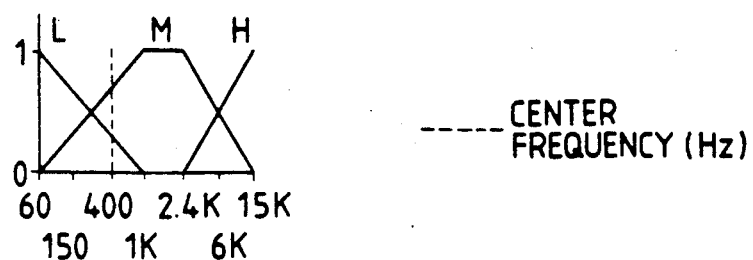
FIG. 4(a) ----- CENTER FREQUENCY (Hz)
FIG. 4(b) ----- AMOUNT OF BOOST
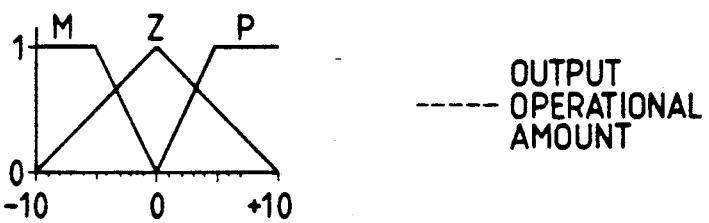
FIG. 4(c) ----- OUTPUT OPERATIONAL AMOUNT
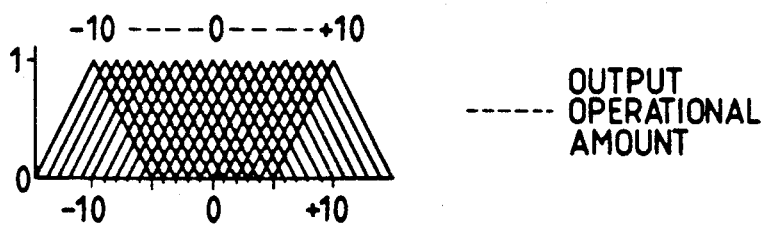
FIG. 4(d) ----- OUTPUT OPERATIONAL AMOUNT

FIG. 5

| RULE NO. | CENTER FREQUENCY | INPUT PRESENT AMOUNT OF BOOST | INPUT OPERATIONAL AMOUNT | OUTPUT OPERATIONAL AMOUNT |
|---|---|---|---|---|
| 1 | L | M | M | 7 |
| 2 | L | M | Z | 0 |
| 3 | L | M | P | 3 |
| 4 | L | Z | M | 2 |
| 5 | L | Z | Z | 0 |
| 6 | L | Z | P | -2 |
| 7 | L | P | M | -3 |
| 8 | L | P | Z | 0 |
| 9 | L | P | P | -7 |
| 10 | M | M | M | 4 |
| 11 | M | M | Z | 0 |
| 12 | M | M | P | 6 |
| 13 | M | Z | M | -1 |
| 14 | M | Z | Z | 0 |
| 15 | M | Z | P | 1 |
| 16 | M | P | M | -6 |
| 17 | M | P | Z | 0 |
| 18 | M | P | P | -4 |
| 19 | H | M | M | 10 |
| 20 | H | M | Z | 0 |
| 21 | H | M | P | 0 |
| 22 | H | Z | M | 5 |
| 23 | H | Z | Z | 0 |
| 24 | H | Z | P | -5 |
| 25 | H | P | M | 0 |
| 26 | H | P | Z | 0 |
| 27 | H | P | P | -10 |

FIG. 6

| RULE NO. | CENTER FREQUENCY | INPUT PRESENT AMOUNT OF BOOST | INPUT OPERATIONAL AMOUNT | OUTPUT OPERATIONAL AMOUNT |
|---|---|---|---|---|
| 1 | L | M | M | 2 |
| 2 | L | M | Z | 0 |
| 3 | L | M | P | 8 |
| 4 | L | Z | M | -3 |
| 5 | L | Z | Z | 0 |
| 6 | L | Z | P | 3 |
| 7 | L | P | M | -8 |
| 8 | L | P | Z | 0 |
| 9 | L | P | P | -2 |
| 10 | M | M | M | 0 |
| 11 | M | M | Z | 0 |
| 12 | M | M | P | 10 |
| 13 | M | Z | M | -5 |
| 14 | M | Z | Z | 0 |
| 15 | M | Z | P | 5 |
| 16 | M | P | M | -10 |
| 17 | M | P | Z | 0 |
| 18 | M | P | P | 0 |
| 19 | H | M | M | 2 |
| 20 | H | M | Z | 0 |
| 21 | H | M | P | 8 |
| 22 | H | Z | M | -3 |
| 23 | H | Z | Z | 0 |
| 24 | H | Z | P | 3 |
| 25 | H | P | M | -8 |
| 26 | H | P | Z | 0 |
| 27 | H | P | P | -2 |

FIG. 7

| RULE NO. | CENTER FREQUENCY | INPUT PRESENT AMOUNT OF BOOST | INPUT OPERATIONAL AMOUNT | OUTPUT OPERATIONAL AMOUNT |
|---|---|---|---|---|
| 1 | L | M | M | 2 |
| 2 | L | M | Z | 0 |
| 3 | L | M | P | 8 |
| 4 | L | Z | M | -3 |
| 5 | L | Z | Z | 0 |
| 6 | L | Z | P | 3 |
| 7 | L | P | M | -8 |
| 8 | L | P | Z | 0 |
| 9 | L | P | P | -2 |
| 10 | M | M | M | 5 |
| 11 | M | M | Z | 0 |
| 12 | M | M | P | 5 |
| 13 | M | Z | M | 0 |
| 14 | M | Z | Z | 0 |
| 15 | M | Z | P | 0 |
| 16 | M | P | M | -5 |
| 17 | M | P | Z | 0 |
| 18 | M | P | P | -5 |
| 19 | H | M | M | 10 |
| 20 | H | M | Z | 0 |
| 21 | H | M | P | 0 |
| 22 | H | Z | M | 5 |
| 23 | H | Z | Z | 0 |
| 24 | H | Z | P | -5 |
| 25 | H | P | M | 0 |
| 26 | H | P | Z | 0 |
| 27 | H | P | P | -10 |

APPARATUS FOR CONTROLLING ACOUSTICAL TRANSFER CHARACTERISTICS

This is a continuation of application Ser. No. 07/514,058 filed Apr. 24, 1990, now abandoned.

BACKGROUND OF THE INVENTION

This invention relates to an acoustical transfer characteristic controller for controlling the characteristics of acoustical transfer of audio reproduction output signals and, more particularly, to an acoustical transfer characteristic controller suitable for use as an apparatus for controlling the acoustical transfer characteristics of a sound field, such as a graphic equalizer or a surrounding processor.

Various controllers for processing reproduction signals supplied from audio reproduction systems to achieve acoustic effects with reality have been developed. Typically, a type of graphic equalizer is known which divides the reproduction frequency range into a plurality of frequency bands each of which can be controlled independently, and a type of surround processor is also known which is based on difference of signal transmission time for improving the presence.

The human ear has auditory sensitivity characteristics such that sounds in a low frequency range and a high frequency range become difficult to hear as the sound pressure level is reduced, as indicated by Fletcher Manson curves of FIG. 15. In the conventional controllers, however, only compensation is effected in accordance with a compensation curve irrespective of changes in the sound pressure level, which curve is previously adjusted and set.

On the other hand, a loudness control circuit which boosts low and high frequency levels when the sound volume is small is known as a means for compensating for the auditory sensitivity characteristics with changes in the sound pressure level. The compensation curve thereby obtained is definitely determined by circuit constants and cannot be finely adjusted.

Automatization of optimum adjustment for compensation for the sensitivity characteristics of the human ear may be studied based on providing the graphic equalizer or the surround processor with the same function as that of the loudness control circuit. For this automatization, however, each of the above described types of controllers requires a means for setting all possible conditions and a means for storing the corresponding characteristic patterns, and hence, a memory having a very large capacity.

SUMMARY OF THE INVENTION

It is therefore an object of the present invention to provide an acoustical transfer characteristic controller capable of being adapted for compensation of the auditory sensitivity characteristics of a listener which change with changes in the volume of reproduced sound.

To achieve this object, according to the present invention, there is provided an acoustic transfer characteristic controller including: an input section for inputting data on acoustical transfer decision factors determining the acoustical transfer characteristics of an audio reproduction output signal; an arithmetic section for calculating a value of control of the acoustic transfer characteristics of the audio reproduction output signal by fuzzy inference based on the decision factors; and an operational section for changing the acoustical transfer characteristics of the audio reproduction output signal based on a calculated control value, the decision factors including a factor for compensating for auditory sensation characteristics which vary depending upon the sound volume level (hereinafter referred to as sound volume factor).

In accordance with the present invention, decision factor data for determining the acoustical transfer characteristics is input through the input section, sound volume factor data is further input, and the arithmetic section performs fuzzy computation using the input decision factor data. Decision factor data other than the sound volume factor data includes, for example, a frequency characteristic factor and a reverberation characteristic factor. In the arithmetic section, fuzzy inference is effected to calculate a control value for obtaining characteristics more suitable for the human sensation on the basis of rules containing ambiguities. The operational section changes the audio reproduction output signal based on the calculated value. It is thereby possible to obtain by a simple operation acoustical transfer characteristics suitable for the auditory sensitivity characteristics of a listener with changes in the sound volume as well as to obtain sound transfer characteristics more suitable for the human sensation. Moreover, there is no need for storing, in a memory or the like, all supposed characteristic patterns for fuzzy inference based on given decision factors, and the computation process is simple, thereby enabling real time adjustment. The construction of the apparatus can therefore be simplified while ensuring the variety of obtained characteristics.

BRIEF DESCRIPTION OF THE DRAWINGS

FIG. 1 is a schematic block diagram of a first embodiment of the present invention;

FIG. 3 is a table showing examples of sound volume factor production rules;

FIGS. 4(a) to 4(d) are diagrams showing membership functions of decision factors other than the sound volume factor, respectively;

FIG. 5 is a table showing examples of aesthetic factor production rules;

FIG. 6 is a table showing examples of power factor production rules;

FIG. 7 is a table showing examples of depth factor production rules;

DESCRIPTION OF THE PREFERRED EMBODIMENTS

Figure 2A:
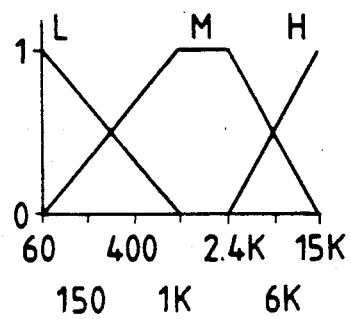
FIG. 2(a) to 2(c) are diagrams showing membership functions with respect to a sound volume factor.

Embodiments of the present invention will be described below in detail with reference to FIGS. 1 to 14.

First Embodiment

FIG. 1 shows a schematic block diagram of an embodiment in which the present invention is applied to a graphic equalizer.

First, the construction of this embodiment will be schematically described below. A fuzzy graphic equalizer (hereinafter referred to as a fuzzy equalizer) 1 has a display operation section (input section) 2 for effecting display of data and for inputting data, a fuzzy computation section 3 for calculating by fuzzy inference, changes in decision factors determining the acoustical transfer characteristics on the basis of input data, a memory section 4 for storing various membership functions or the like necessary for fuzzy inference, and a decision factor changing section (operational section) 6 for changing the decision factors relating to an input audio signal 5 on the basis of the results of calculation effected by the fuzzy computation section 3. The fuzzy computation section 3 and the memory section 4 forms an arithmetic section. The operator inputs changes, to be desired, in the decision factors other than sound volume factors into the display operation section 2, and a change in the sound volume is automatically taken from the position of the moving element of a volume control variable resistor or the like by the fuzzy computation section. The fuzzy computation section 3 effects fuzzy inference based on the changes in the decision factors, the change in the sound volume and the membership functions stored in the memory section 4 to obtain the absolute change in each decision factor. Thereafter, the decision factor changing section 6 changes the decision factors for an input audio signal 5 and outputs the changed signal as an output audio signal 7.

Figure 15:
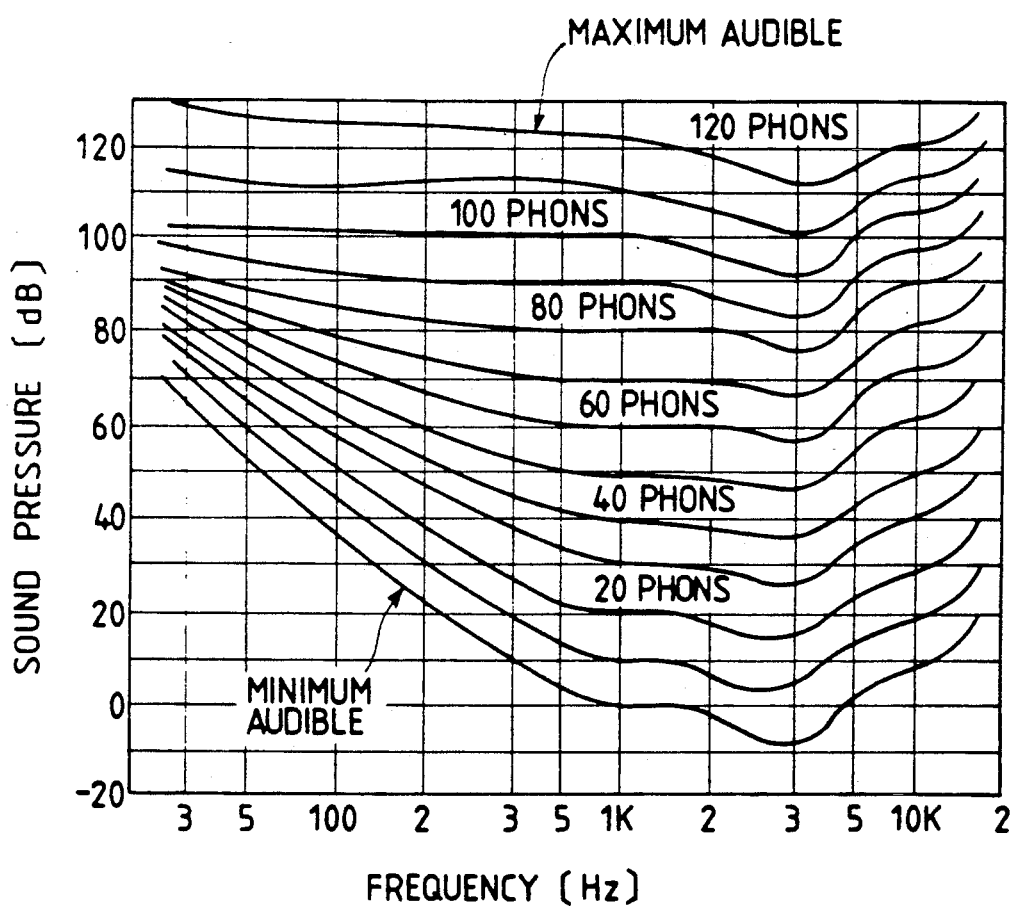
FIG. 15 is a diagram of auditory sensitivity characteristics.

Details of this embodiment will now be described below. It is known that in auditory sensitivity characteristics with respect to the sound pressure levels, high and low frequency sounds become difficult to hear as the sound pressure level is reduced (refer to FIG. 15). In this embodiment, the frequency characteristics and the sound volume are considered and the decision factors relating to them are controlled.

In a case where fuzzy inference is effected with respect to a sound volume factor, respective center frequencies of divided frequency bands and the present sound volume are used as input conditions, and the amount of boost of signal level corresponding to the center frequency of each divided frequency band is output as an output operational value (amount) from the fuzzy computation section 3 to the decision factor changing section 6.

Figure 2B:
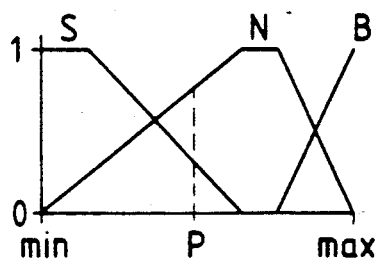
Figure 2C:
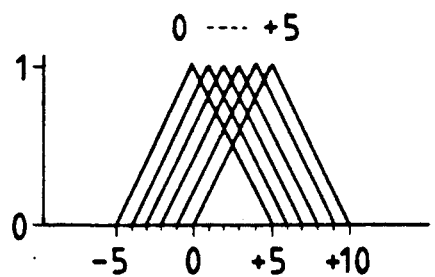

FIGS. 2(a) to 2(c) show membership functions for effecting fuzzy inference based on the volume factor. FIG. 2(a) shows membership functions corresponding to each center frequency.

The number of divisions of audio frequency ranges (bands) of the equalizer is set at 7, the number of operating steps for each frequency range is set at ±5 (FIG. 2(c) and FIG. 8), and the range of the input operational value of each factor except the volume factor input from the display operation section 2 is set at ±10 (FIG. 4c).

In FIG. 2(a), the abscissa represents the frequencies and the ordinate represents grades (absolute numbers) of the functions indicating the degrees with respect to the frequencies. L(low), M(middle) and H(high) denote the membership functions which respectively represent low frequencies, middle frequencies and high frequencies. As the grade becomes closer to 1, the degree becomes higher. For example, with respect to a frequency of 400 Hz, the grade of the membership function L is about 0.3 while the grade of the membership function M is about 0.7, which indicates that this frequency is a medium frequency somewhat low.

FIG. 2(b) shows membership functions representing the present sound volume. The abscissa represents the sound volume and the ordinate represents grades (absolute numbers) of the functions indicating degrees with respect to the sound volume. S(small), N(normal) and B(big) denote the membership functions which respectively represent small volumes, normal volumes and large volumes. For example, with respect to the sound volume at the point P, the grade of the membership function S is about 0.3 while the grade of the membership function N is about 0.7, which indicates that the present sound volume is a normal volume somewhat small.

FIG. 2(c) shows membership functions representing the output operational amount. The abscissa represents the output operational amount and the ordinate represents grades (absolute numbers) of the functions indicating degrees with respect to the output operational amount.

FIG. 3 shows examples of volume decision factor production rules. Symbols or marks used in FIG. 3 correspond to those used in FIG. 2.

For example, the rule number 3 relates to a case where the center frequency is high (H) and where the present sound volume is small (S). In this case, the output operational amount is approximately 3 (fuzzy quantity).

It has been reported that the human auditory sensitivity characteristics can be expressed with at least three decision factors independent of each other. In accordance with this embodiment, three factors other than the sound volume factor, i.e., an aesthetic factor relating to aesthetic elements of reproduced sound, a power factor relating to impressing power of the reproduced sound and a depth factor relating to the depth of the reproduced sound are controlled.

Each decision factor depends upon the frequency characteristics and is generally defined as described below.

As the value of the aesthetic factor is increased, the tone becomes softer based on reducing high and low frequency components or, as the value of the factor is reduced, the tone becomes brighter based on boosting high and low frequency components.

As the value of the power factor is increased, the whole range is boosted based on specially emphasizing middle range components or, as the value of the factor is reduced, middle range components are reduced at the highest rate.

As the value of the depth factor is increased, high frequency components are reduced while low frequency components are boosted or, as the value of the factor is reduced, low frequency components are reduced while high frequency components are boosted.

In this case, three conditions: the equalizer center frequencies of divided frequency bands; the amount of boosting of the signal level corresponding to each center frequency; and the input operational amount of each of the three factors that an operator wishes to change are used as input conditions for fuzzy inference, and the amount of boost relative to the present amount of boost corresponding to each center frequency is output as the operational output amount.

FIGS. 4(a) to 4(d) show membership functions for effecting fuzzy inference based on the above three factors.

FIG. 4(a) shows membership functions representing the center frequency. The abscissa represents the center frequencies and the ordinate represents grades (absolute numbers) of the functions indicating the degrees with respect to the respective frequencies. L(low), M(middle) and H(high) denote the membership functions which represent low, middle and high frequencies, respectively. As the grade becomes closer to 1, the degree becomes higher. For example, with respect to a frequency of 400 Hz, the grade of the membership function L is about 0.3 while the grade of the membership function M is about 0.7, which indicates that this frequency is a medium frequency somewhat low.

FIG. 4(b) shows membership functions representing the present amount of boost. The abscissa represents the amount of boost and the ordinate represents grades (absolute numbers) of the functions indicating degrees with respect to the amount of boost. M (minus), Z (zero) and P (plus) denote the membership functions which represent negative, naught, and positive amounts of boost, respectively. For example, if the present amount of boost is $-1$, the grade of the membership function M is about 0.3 while the grade of the membership function Z is about 0.8, which indicates that the present amount of boost is negative close to 0.

FIG. 4(c) shows membership functions representing the input operational value. The abscissa represents the input operational amount and the ordinate represents grades (absolute numbers) of the functions indicating degrees with respect to the input operational value. Except for this, FIG. 4(c) is the same as FIG. 4(b).

FIG. 4(d) shows membership functions representing the output operational value. The abscissa represents the output operational value and the ordinate represents grades (absolute numbers) of the functions indicating degrees with respect to the output operational value.

FIG. 5 shows examples of aesthetic factor production rules. Symbols or marks used in FIG. 5 correspond to those used in FIG. 2.

For example, the rule number 4 relates to a case where the center frequency is low (L) and where the present amount of boost at the corresponding center frequency is zero (Z). In this case, the input operational value is minus (M), that is, the operator wishes to reduce the aesthetic factor, and the resulting output operational value is approximately 2 (fuzzy quantity).

Figure 8A:
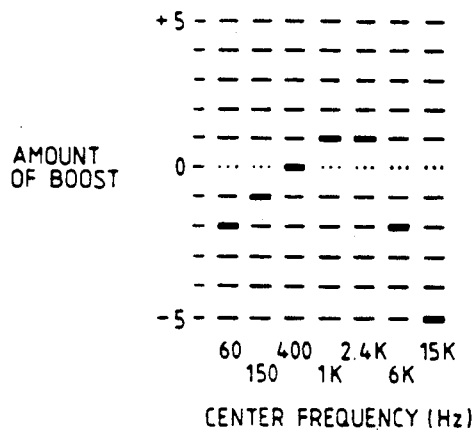
FIG. 8(a), 8(b), 8(c), 8(d) 8(e) and 8(f) are equalizer patterns with respect to three decision factors.
Figure 8B:
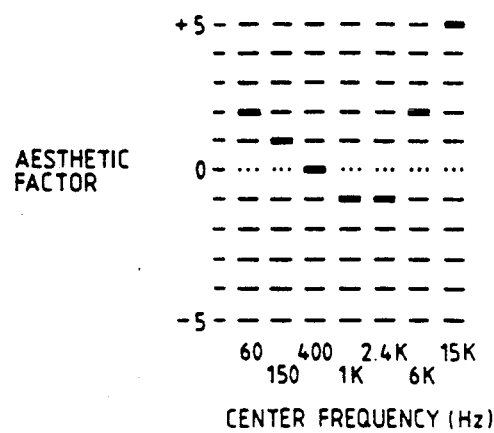
Figure 8C:
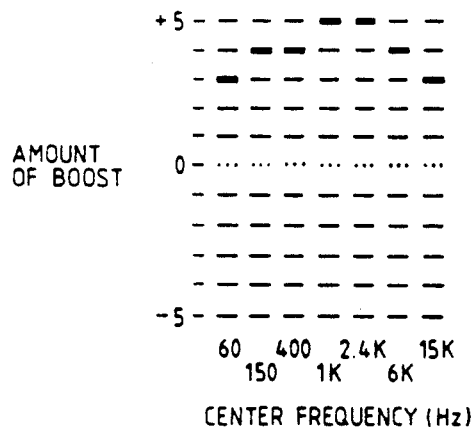
Figure 8D:
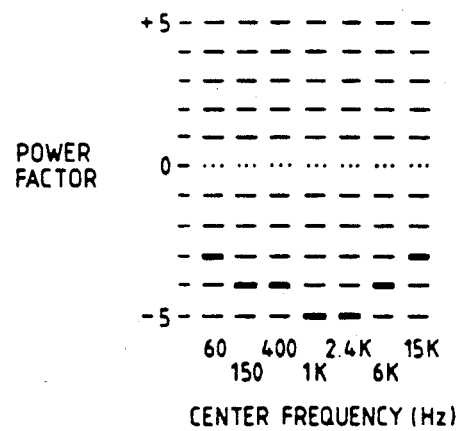
Figure 8E:
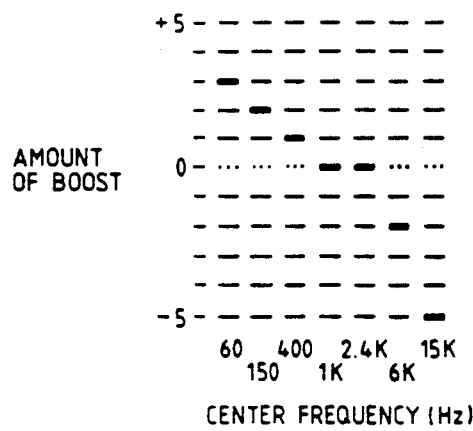
Figure 8F:
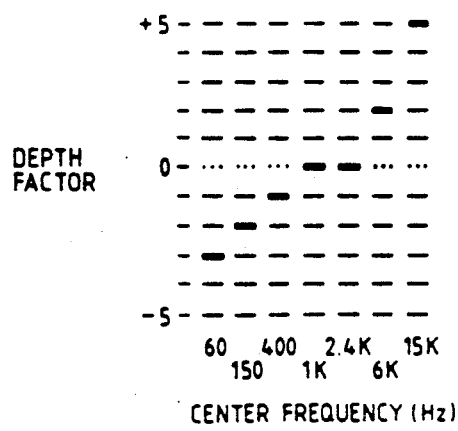

FIGS. 6 and 7 show examples of power factor production rules and depth factor production rules, respectively. The contents thereof are similar to those of the aesthetic factor production rules shown in FIG. 5. FIG. 8 shows changes of equalizer pattern (that is, each boost amount corresponding to each center frequency) in case that the production rules shown in FIGS. 5 to 7 are adapted. FIG. 8(a) and 8(b) show the equalizer patterns of the aesthetic factor, FIGS. 8(c) and 8(d) show those of the power factor and FIG. 8(e) and 8(f) show those of the depth factor. The initial equalizer pattern is determined flat when the amount of boost is 0, and two boost patterns with respect to each factor when each factor is determined maximum and minimum are shown, respectively.

To actually effect fuzzy inference by using production rules shown in FIGS. 2 to 10, procedures described below are used. The followings are inference methods based on min-max centroid methods. Inference of the sound volume factor is effected first and followed by inference of decision factors other than the sound volume factor.

a) Method of inference of the sound volume factor

①  Input conditions based on the center frequency and the present sound volume are provided for each of membership functions, and the value of the grade at each point of intersection therebetween is set as the degree of adaptation of each membership function to each input condition.

②  The smaller one of the two degrees of adaptation of the two membership functions with respect to the center frequency and the sound volume for the corresponding production rule is set as the degree of adaptation of the production rule to the input conditions (called the degree of rule adaptation).

③  The output operational values of all the production rules are weighted with the degree of rule adaptation. The maximum values of the respective output operational values are obtained as a result of fuzzy inference, and the centroid of them is obtained as the final inference result (min-max centroid method).

b) Method of inference decision factors other than the sound volume factor.

Inference of decision factors other than the sound volume factor is effected as in the case of the sound volume factor as described below.

①  Three input conditions: the center frequency, the present amount of boost, and the input operational value of the factor that the operator wishes to change are provided for each membership function, and the value of the grade at the point of intersection therebetween is set as the degree of adaptation of the membership function to the input conditions.

②  The minimum of the three degrees of adaptation of the three membership functions for the corresponding production rule is set as the degree of adaptation of the production rule to the input conditions (called the degree of rule adaptation).

③  The output values of all the production rules are weighted with the degrees of rule adaptation. The maximum values of the respective output operational values are obtained as a result of fuzzy inference, and the centroid of them is obtained as the final inference result (min-max centroid method).

Figure 9A:
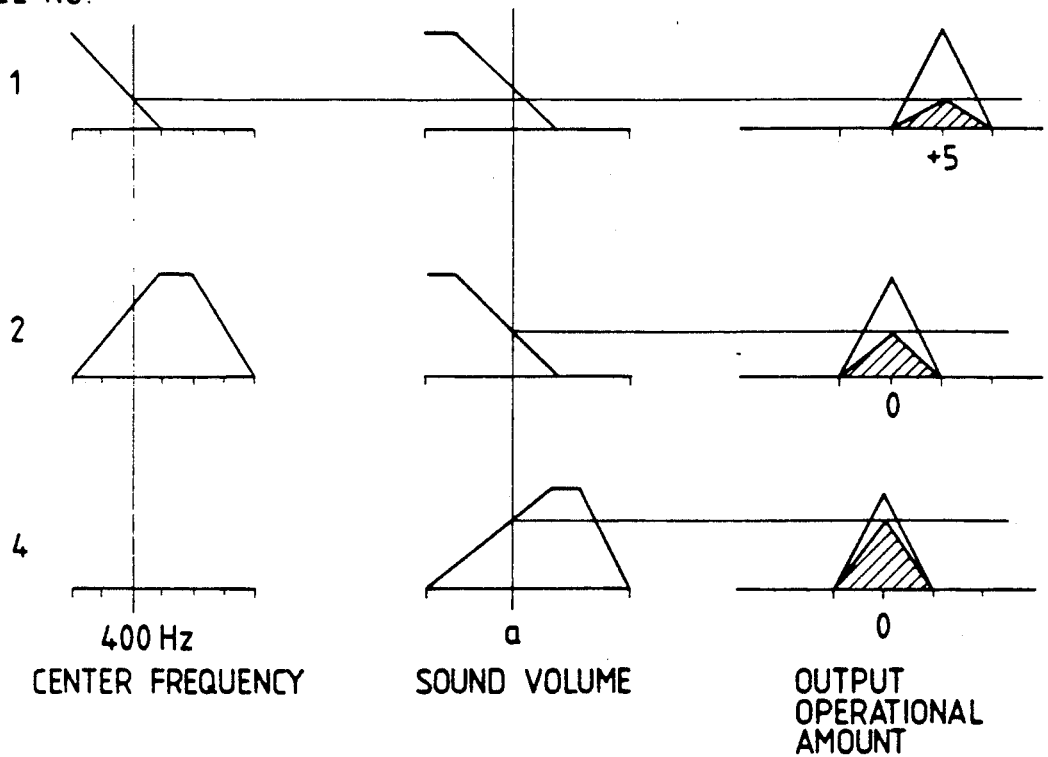
FIGS. 9(a) and 9(b) are diagrams of fuzzy inference for the sound volume factor, respectively.
Figure 9B:
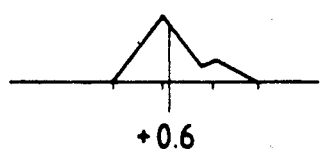

FIGS. 9(a) and 9(b) show an example of actual fuzzy inference of the sound volume factor. In this example, the center frequency is 400 Hz and the present sound volume is set at a.

FIG. 9(a) shows the production rules indicating degrees of adaptation which are not zero while omitting those indicating degrees of adaptation which are equal to 0.

Regarding the production rule number 1, for example, the point of intersection of the center frequency of 400 Hz and the membership function L, i.e., the degree of adaptation is about 0.3. Similarly, the degree of adaptation of the membership function M to the present sound volume is about 0.4. The degree of rule adaptation of the production rule number 1 is 0.3 which is the minimum of these values.

The degree of rule adaptation of each of the other rules having degrees of adaptation not zero is obtained in the same manner.

Next, the output operational amount corresponding to each production rule number is obtained. For example, the output operational amount of the production rule 1 is +5 (refer to FIG. 3).

The membership function of the output operational amount corresponding to each obtained output is obtained from FIG. 2(c), and is weighted with the degree of rule adaptation. (In fact, hatched triangular areas shown in FIG. 9(a) are obtained).

FIG. 9(b) shows a result of fuzzy inference of the total output operational value. In this case, a pattern obtained by weighting the output operational values with respect to all production rules and superposing the weighted output operational values (each hatched triangle portion) is obtained as a result of fuzzy inference of the total output operational value (that is, regarding one output operational value, the maximum of the weighted output operational value is used as the corresponding output operational value).

Next, the centroid of the result of the fuzzy inference of the total output operational value obtained as shown in FIG. 9(b) is calculated and the solution is used as the inference result. In this example, the output value is approximately +0.6.

Figure 10A:
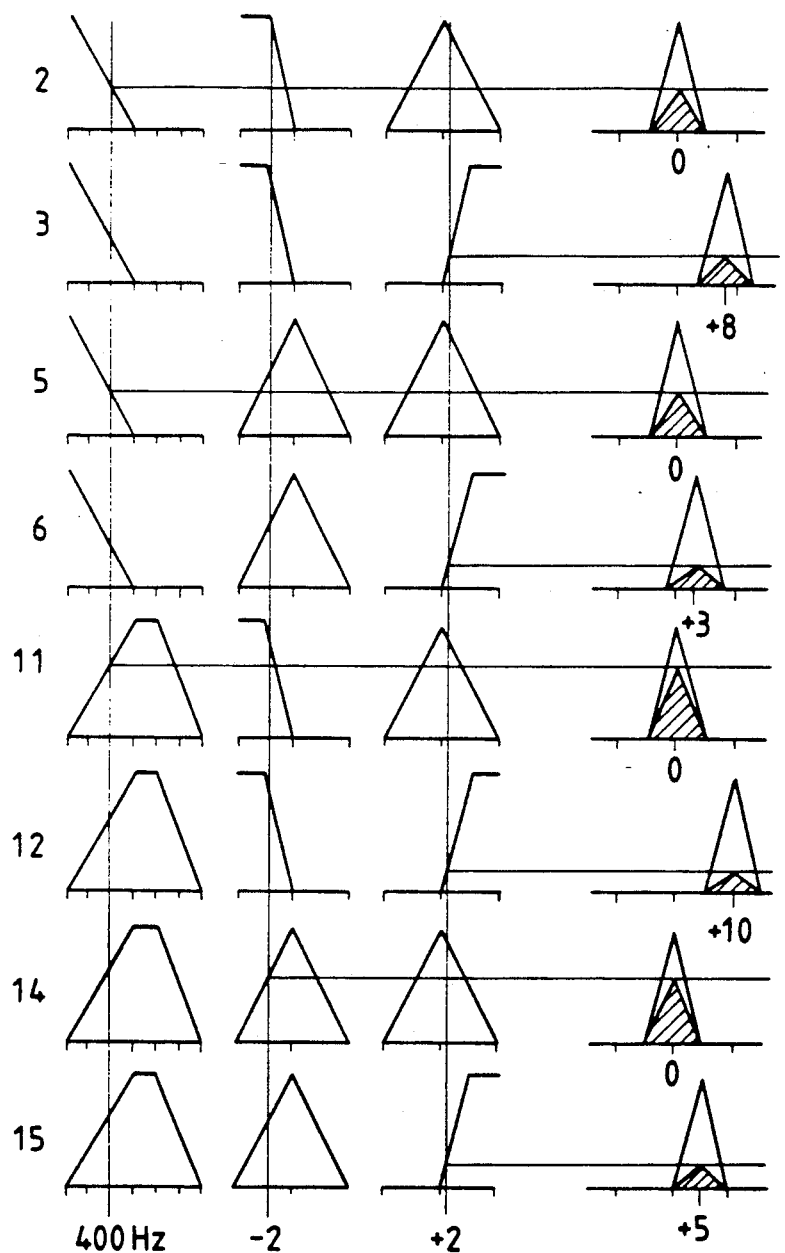
FIGS. 10(a) and 10(b) are diagrams of fuzzy inference for decision factors other than the sound volume factor, respectively.
Figure 10B:
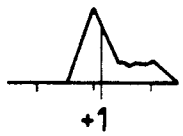

FIGS. 10(a) and 10(b) show an example of actual fuzzy inference of the other decision factors. In this example, the center frequency is 400 Hz and the input operational value of the power factor is set at +2 while the present amount of boosting of the equalizer is −2.

FIG. 10(a) shows the production rules indicating degrees of adaptation which are not zero while omitting those indicating degrees of adaptation which are equal to 0, as in the case of FIG. 9(a).

Regarding the production rule number 3, for example, the point of intersection of the center frequency of 400 Hz and the membership function L, i.e., the degree of adaptation thereof is about 0.3. Similarly, the degree of adaptation of the membership function M to the present amount of boost is about 0.8, and the degree of adaptation to the input operational amount is about 0.2. The degree of rule adaptation of the production rule number 3 is 0.2 which is the minimum of these values.

The degree of rule adaptation of each of the other rules having degrees of adaptation which are not zero is obtained in the same manner.

Next, the output operational amount corresponding to each production rule number is obtained. For example, the output operational amount of the production rule number 3 is 8 (refer to FIG. 6).

The membership function of the output operational amount is obtained from FIG. 4(d), and is weighted with the degree of rule adaptation. (In fact, hatched triangular areas shown in FIG. 10(a) are obtained).

FIG. 10(b) shows a result of fuzzy inference of the total output operational amount. In this case, a pattern obtained by weighting the output operational amounts with respect to all production rules and superposing the weighted output operational amounts is obtained as a result of fuzzy inference of the total output operational value (that is, regarding one output operational value, the maximum of the weighted output operational value is used as the corresponding output operational value).

Next, the centroid of the result of the fuzzy inference of the total output operational amount obtained as shown in FIG. 10(b) is calculated and the solution is used as the inference result. In this example, the output value is approximately +1.

Figure 11A:
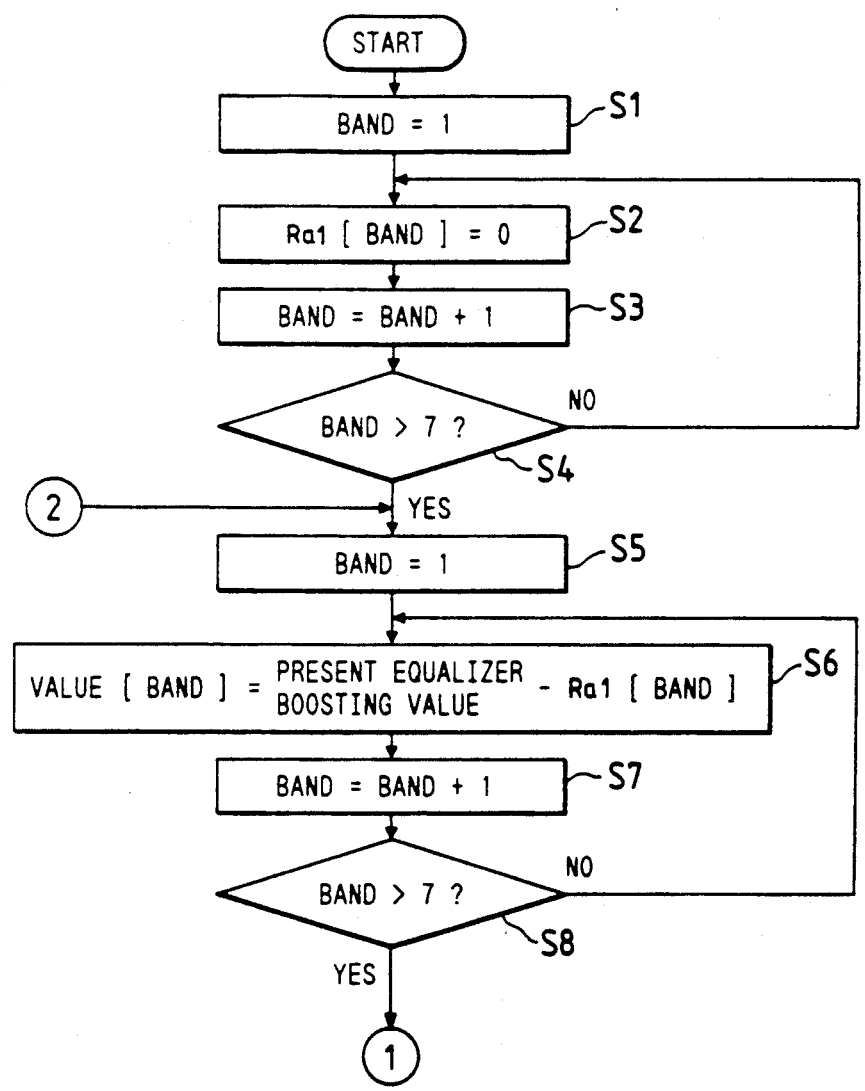
FIG. 11(a) and 11(b) are flow charts of the operation of a first embodiment of the present invention, respectively.
Figure 11B:
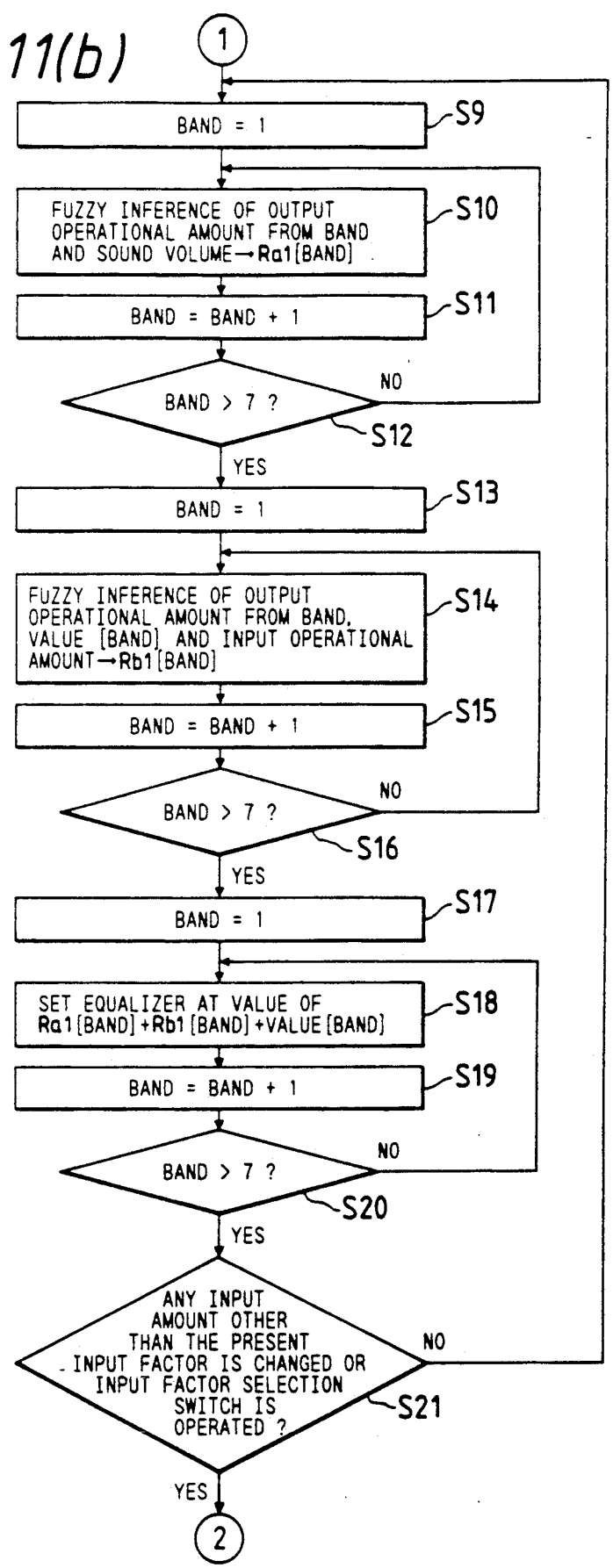

The operation of this embodiment will be described below with reference to the flow chart shown in FIGS. 11(a) and 11(b).

A variable Band indicating the center frequency is set at 1 (step S1). The variable Band changes from 1 to 7, and these values designate center frequencies of seven split frequency bands.

A recorded value of an area Ra1 [Band] corresponding to Band 1 of a memory Ra [Band] (result of fuzzy inference) for storing the result of inference of the volume factor is set at 0 (step S2).

The value of Band is incremented by 1 (step S3), and, if the value of Band is greater than 7, the process proceeds to step S5 or, if the value of Band is not greater than 7, processing of steps S2 to S4 is repeated. Thus, the amount of boost of all frequency bands are set at 0. That is, the seven areas Ra1, Ra2–Ra7 of the memory Ra are initialized, respectively.

Band is set at 1 again (step S5), and a variable Value [Band] indicating the output operational value at each center frequency is set at a certain value obtained by subtracting Ra1 [Band] (result of fuzzy inference) from the present amount of boosting of the equalizer (step S6). At the beginning, Ra1 [Band] is 0.

The value of Band is incremented by 1 (step S7), and determination is made as to whether or not the value of Band is greater than 7 (step S8). If Band is greater than 7, the process proceeds to step S9, or if Band is not greater than 7, processing of steps S6 to S8 is repeated. At the beginning, every recorded value of the areas of the memory Ra equals a present boost amount.

The value of Band is set at 1 (step 9) to perform fuzzy inference with respect to each center frequency of every frequency bands and volume of sound. An output operational amount corresponding to Band 1 is stored in the memory area Ra1 having seven storing areas. (step 10). Next, fuzzy inference is performed with respect to seven Bands. That is, the value of Band is incremented by 1 until the value reaches 7 (steps 11 and 12). Thus, every output amount corresponding to each Band is obtained.

Band is set at 1 again (step S13), and the output amount is obtained by fuzzy inference from Band (center frequency), Value [Band] (see step 6) and an input operational amount. The result is stored in a memory area Rb1 of a memory Rb [Band] having seven storing areas (Step S14).

The value of Band is incremented by 1 (step S15), and determination is made as to whether or not the value of Band is greater than 7 (step S16). If Band is greater than 7, the process proceeds to step S17, or if Band is not greater than 7, processing of steps S14 to S16 is repeated. That is, inference results are stored in all seven memory areas Rb1, Rb2–Rb7.

Band is set at 1 again (step S17), and Band 1 of the equalizer is set at a value of the sum of memory Ra1 [Band] (see step S10), memory Rb1 [Band] (see step S14) and Value [Band] (see step S6) (step S18).

The value of Band is incremented by 1 (step S19), and determination is made as to whether or not the value of Band is greater than 7 (step S20). If Band is greater than 7, the process proceeds to step S21, or if Band is not greater than 7, processing of steps S18 to S20 is repeated. That is, seven memory areas Rb1, Rb2–Rb7 are set at each calculated value in the same manner.

Determination is made as to whether or not each input value other than the present input factor is changed or whether or not the input factor selection switch is operated (step S21). If the input operational amount is changed or if the input factor selection switch is operated, processing of steps S5 to S21 is repeated. If not, processing of steps S9 to S21 is repeated.

In this operation, each factor is independently computed and a result of computation based on one of the decision factors is used as fundamental data for computation of other decision factors. That is, if the aesthetic factor is computed after the computation of the power factor, a result of computation based on the aesthetic factor is used as fundamental data for computation of the power factor.

As described above, changes based on the same or other decision factors are effected based on the obtained acoustical transfer characteristics to obtain the desired tone. Alternatively, the arrangement may be such that a plurality of decision factors are previously input, fuzzy computation of each input decision factor is performed, and the acoustical transfer characteristics are thereafter changed based on the results of fuzzy computation of all the input decision factors.

Second Embodiment

Figure 12:
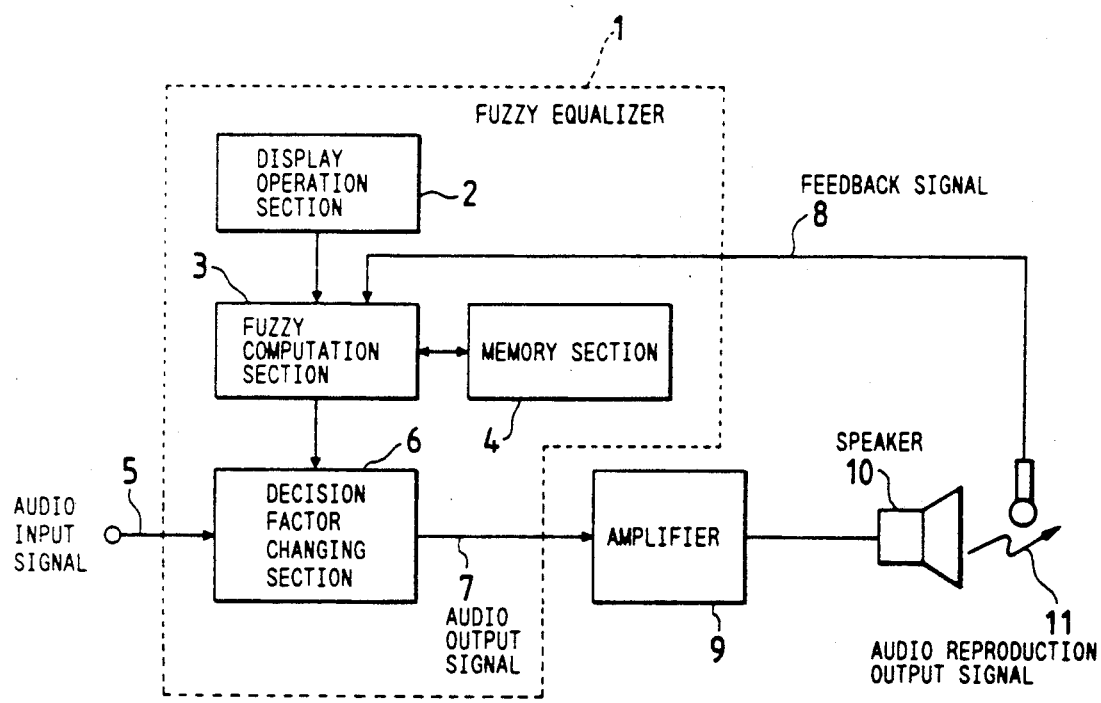
FIG. 12 is a block diagram of a second embodiment of the present invention.

FIG. 12 shows a block diagram of a second embodiment of the present invention. Components identical to those of the first embodiment are indicated by the same reference characters and the detailed description for them will not be repeated.

This embodiment differ from the embodiment shown in FIG. 1 in that a feedback signal 8 of the audio reproduction output signal is used as a decision factor.

Even though the graphic equalizer changes the audio input signal 5 based on the input decision factors, there is a possibility of failure to obtain the desired acoustical transfer characteristics, due to the reproduction performance of an amplifier 9, a speaker 10 and the like connected to the rear stage of the graphic equalizer. To solve this problem, part of the audio reproduction output signal 11 is taken as the feedback signal 8 and is used as a decision factor for fuzzy computation, thereby obtaining acoustical transfer characteristics substantially equal to the desired characteristics. Except for this, this embodiment is the same as the embodiment shown in FIG. 1.

In this example, part of the audio reproduction output signal 11 is taken as the feedback signal 8, but the arrangement may alternatively be such that reproduction frequency characteristics and the like of the amplifier 9 and the speaker 10 are stored in the memory section 4 and are used as decision factors when the acoustical transfer characteristics are changed.

Third Embodiment

Figure 13:
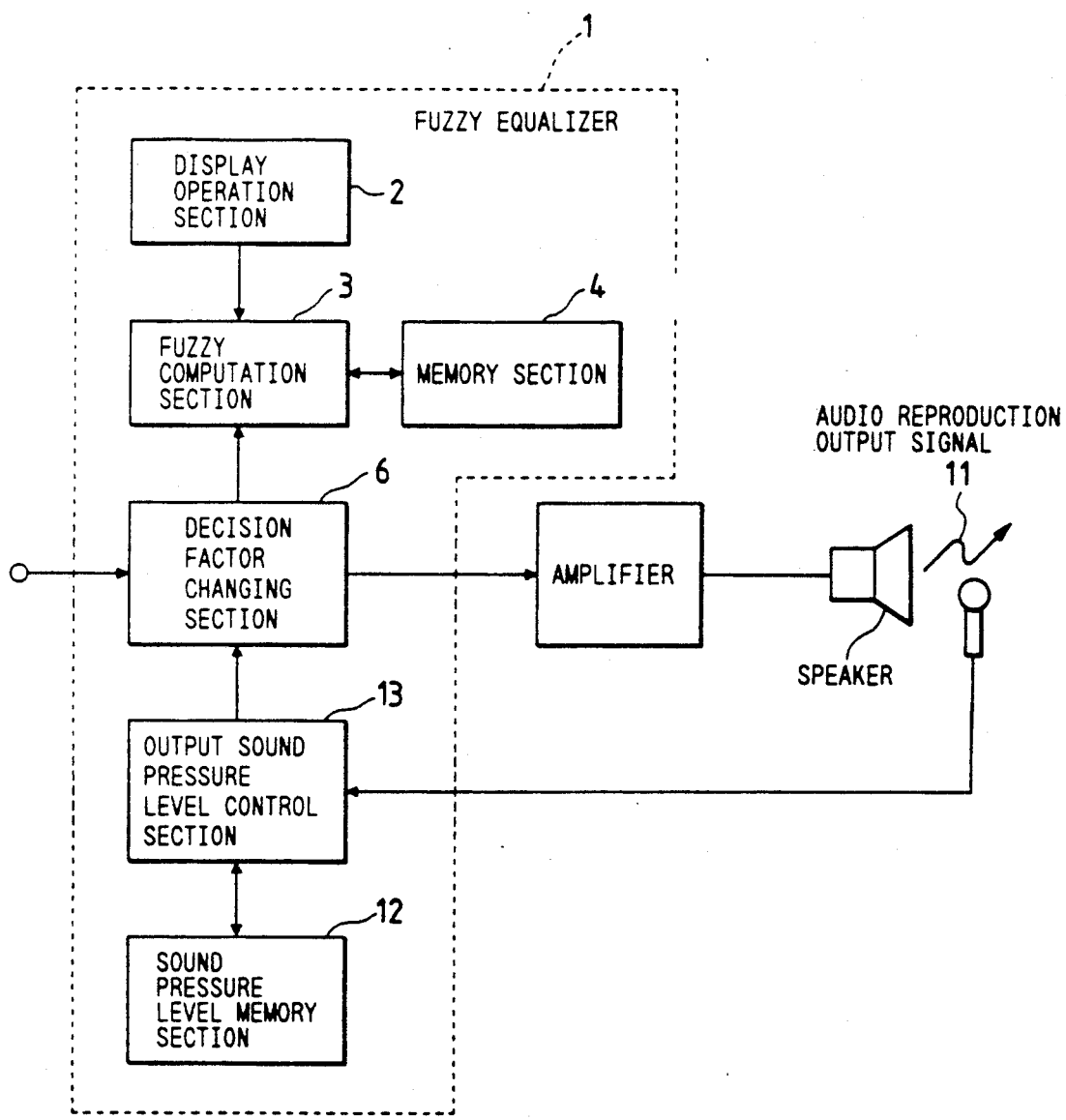
FIG. 13 is a block diagram of a third embodiment of the present invention.

FIG. 13 shows a third embodiment of the present invention. Components identical to those of the embodiment shown in FIG. 12 are indicated by the same reference characters and the detailed description for them will not be repeated.

This embodiment differ from the embodiment shown in FIG. 12 in that a sound pressure level memory section 12 and an output sound pressure level control section 13 are provided in the fuzzy equalizer 1. The sound pressure level memory section 12 stores the sound pressure level of the audio reproduction output signal 11, and the sound pressure control section 13 measures the output sound pressure level when the acoustical transfer characteristics are changed by performing fuzzy computation, and makes the output sound pressure level equal to the stored sound pressure level.

It is thereby possible to maintain a certain sound pressure level even if the acoustical transfer characteristics determined by the fuzzy computation process are changed.

Fourth Embodiment

Figure 14:
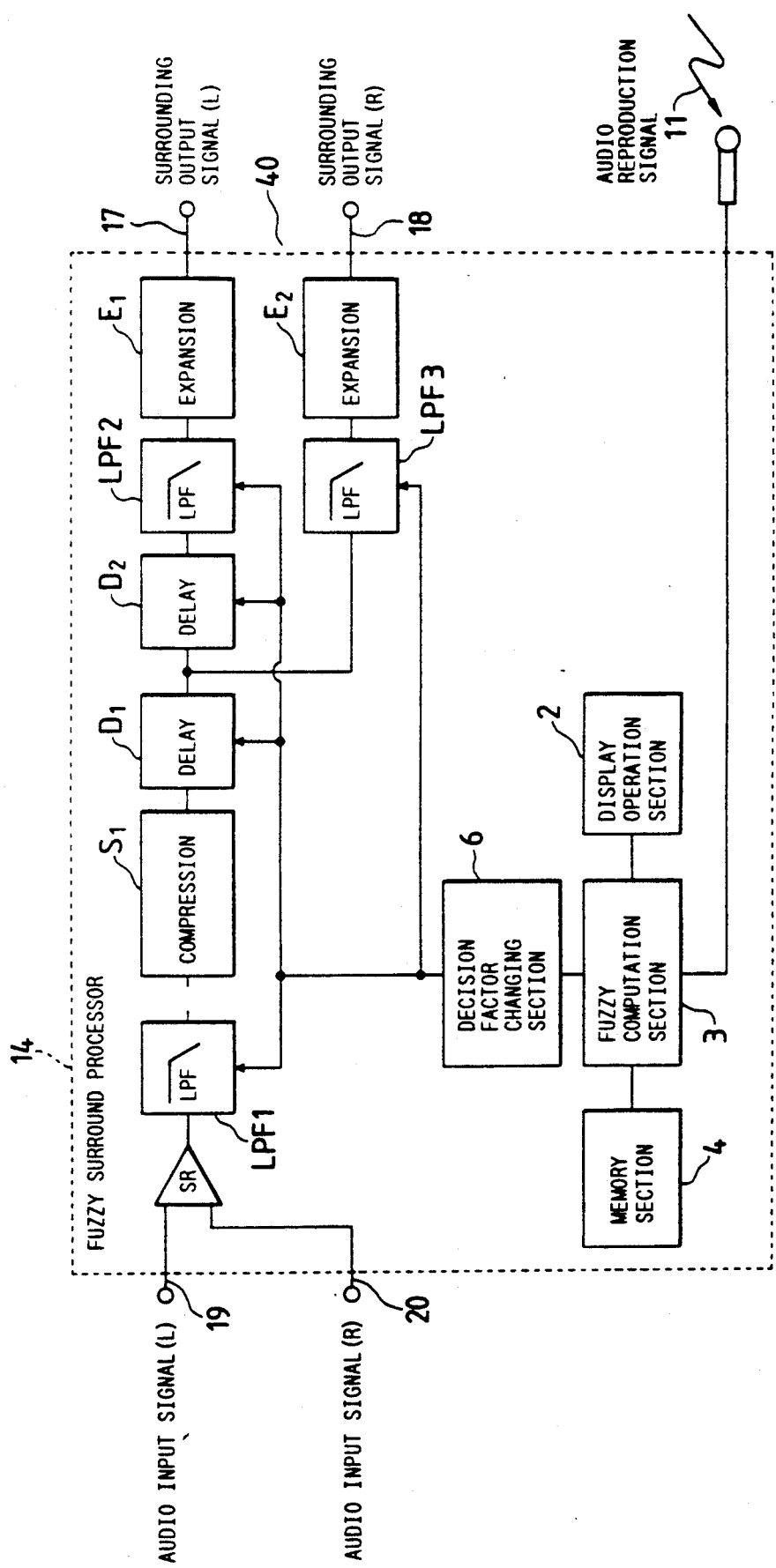
FIG. 14 is a block diagram of a fourth embodiment of the present invention.

FIG. 14 shows a block diagram of a fourth embodiment in which the present invention is applied to a simple surrounding processor 40.

A sound heard in a theater or the like contains, as well as direct sound, a substantially large amount of indirect sound reflected by the surrounding walls, the ceiling and so on. It is difficult to reproduce the presence of such a sound as a sound reproduced by an ordinary reproduction system.

The surrounding processor 40 has a display operation section 2 for effecting display of data and for inputting data, a fuzzy computation section 3 for calculating, by fuzzy inference, changes in decision factors determining the acoustical transfer characteristics on the basis of input data, a memory section 4 for storing membership functions or the like necessary for fuzzy inference, a decision factor changing section 6 for changing the decision factors, a surrounding component extractor SR for extracting L−R components or L+R components from an audio input signal (L) 19 and another audio input signal (R) 20, low pass filters LPF1, LPF2 and LPF3 for preventing unnecessary components from entering delay circuits, the delay circuits D1 and D2 for effecting a delay of 15 to 30 ms, and a compression circuit S1 and expansion circuits E1 and E2 serving for noise reduction.

The surrounding processor 14 processes surrounding components extracted by the surrounding component extractor with the compressor circuit S1, the expander circuits E1, E2 and the delay circuits D1, D2, and outputs an output surrounding (L) signal 17 and an output surrounding (R) signal 18, and the surrounding sound is reproduced by the surrounding sound speakers (not shown), thereby enabling the listener to feel as if the real surrounding sound exists. The presence is thereby created like the sound in the theater. However, the reverberation characteristics greatly vary depending upon the listening room conditions and so on, and it is therefore difficult to obtain the desired presence by using preset surrounding information. Also, there is a possibility of failure to obtain the expected presence at a particular level of the reproduced sound depending upon the auditory sensation characteristics of the listener.

To solve this problem, the following function is provided. The fuzzy surrounding processor 14 takes in the audio input signal 11, measures the reverberation characteristics and performs fuzzy computation by using the actual reverberation characteristics and the desired reverberation characteristics as decision factors to change the characteristics of the low pass filters LPF1, LPF2, LPF3 and the delay circuits D1, D2 thereby obtaining the desired reverberation characteristics and effectively improving the presence based on the volume of the reproduced sound.

A simple example has been described but, recently, digital signal processors (DSP) are frequently used for the purpose of obtaining improved reverberation characteristics. In a case where this type of processor is used, parameters provided for the DSP are determined by fuzzy inference.

In accordance with the present invention, a factor for compensating for the auditory sensation characteristics which vary depending upon the sound pressure level is used as one of decision factors which determine the acoustical transfer characteristics of an audio reproduction output signal, thereby enabling acoustical transfer characteristics adapted to the auditory sensitivity characteristics of the listener with changes in the sound volume to be obtained by a simple operation. There is no need for storing, in a memory or the like, all supposed characteristic patterns for fuzzy inference based on given decision factors, and the computation process is simplified, thereby enabling real time adjustment. The construction of the apparatus can therefore be simplified while ensuring the variety of obtained characteristics. Further, the compensation with changes in sound volume is effected independently of the other decision factors, thereby enabling a reduction in the number of rules for fuzzy computation.

What is claimed is:

1. An apparatus for controlling acoustical transfer characteristics, comprising:
   an input section for inputting a plurality of individually user-alterable acoustical transfer decision factors determining the acoustical transfer characteristics of an audio reproduction output signal;
   an arithmetic section for calculating a control value of the acoustic transfer characteristics of the audio reproduction output signal by fuzzy inference based on the decision factors; and
   an operational section for changing the acoustical transfer characteristics of the audio reproduction output signal based on said calculated control value;
   wherein the decision factors include at least a factor for compensating for auditory sensation characteristics which vary depending upon a sound volume level.

2. An apparatus for controlling acoustical transfer characteristics according to claim 1, wherein the decision factors include a factor which influences frequency characteristics of the audio reproduction signal.

3. An apparatus for controlling acoustical transfer characteristics according to claim 2, wherein the decision factors include a factor which influences the reverberation characteristics of the audio reproduction signal.

4. An apparatus for controlling acoustical transfer characteristics according to claim 2, wherein the decision factors include a feedback signal of the audio reproduction signal as a factor.

5. An apparatus for controlling acoustical transfer characteristics according to claim 2, wherein the decision factors include a reproduction performance factor of a component of a reproduction unit which influences the acoustical transfer characteristics of the audio reproduction signal.

6. An apparatus for controlling acoustical transfer characteristics according to claim 1, wherein the arithmetic section successively repeats computation using each of the decision factors independently so that a result of computation based on one of the decision factors is used as fundamental data for computation of other decision factors.

7. An apparatus for controlling acoustical transfer characteristics according to claim 1, further comprising an output sound pressure level control section for equalizing two output sound pressure levels obtained before and after an operation with each other for changing the acoustical transfer characteristics of the audio reproduction output signal.

8. An apparatus according to claim 1 in which said arithmetic section performs fuzzy inference using inference methods based on min-max centroid methods.

9. An apparatus according to claim 1, wherein said apparatus further comprises a memory section for storing membership functions and production rules, and said arithmetic section performs fuzzy inference based on said decision factors input through the input section, said membership functions and said production rules.

10. An apparatus according to claim 9, wherein said arithmetic section performs fuzzy inference using the min-max centroid method based on said decision factors input through the input section, said membership functions and said production rules.

11. A method of controlling acoustical transfer characteristics of an audio reproduction signal using fuzzy inference, comprising the steps of:
   (a) inputting a plurality of individually user-alterable acoustical transfer decision factors;
   (b) determining, for a plurality of production rules, adaption degrees of each of a plurality of membership functions for each of said decision factors;
   (c) determining, for each of said production rules, a smallest one of said adaption degrees of membership functions as an adaption degree of the production rule;
   (d) producting output operational amounts corresponding to each of said production rules;
   (e) calculating control values of the acoustic transfer characteristics on the basis of said output operational amounts and said adaptation degrees of the production rules; and
   (f) changing the acoustical transfer characteristics of the audio reproduction signal based on said control values;
   wherein the decision factors include at least a factor for compensating for auditory sensation characteristics which vary depending on a sound volume level.

12. A method of controlling acoustical transfer characteristics according to claim 11, wherein said decision factors include a factor which influences frequency characteristics of the audio reproduction signal.

13. A method of controlling acoustical transfer characteristics according to claim 12, wherein said decision factors include a factor which influences reverberation characteristics of the audio reproduction signal.

14. A method of controlling acoustical transfer characteristics according to claim 12, wherein said decision factors include a feedback signal of the audio reproduction signal as a factor.

15. A method of controlling acoustical transfer characteristics according to claim 12, wherein said decision factors include a reproduction performance factor which influences the acoustical transfer characteristics of the audio reproduction signal.

* * * * *